United States Patent
Wasynczuk

(10) Patent No.: US 8,865,604 B2
(45) Date of Patent: Oct. 21, 2014

(54) BULK CARBON NANOTUBE AND METALLIC COMPOSITES AND METHOD OF FABRICATING

(71) Applicant: James Antoni Wasynczuk, Bellflower, CA (US)

(72) Inventor: James Antoni Wasynczuk, Bellflower, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 13/621,585

(22) Filed: Sep. 17, 2012

(65) Prior Publication Data

US 2014/0080378 A1    Mar. 20, 2014

(51) Int. Cl.
*B32B 15/00* (2006.01)
*D04H 1/00* (2006.01)

(52) U.S. Cl.
USPC ........... 442/110; 442/377; 442/379; 428/378; 428/379; 428/389; 977/742; 977/750; 977/752; 977/778; 977/784

(58) Field of Classification Search
CPC .... B82Y 30/00; B82Y 40/00; Y10S 977/742; Y10S 977/75; Y10S 977/752; Y10S 977/842; C01B 2202/02; C01B 2202/08; H01L 21/28556; H01G 11/36
USPC ........... 977/742, 750–752, 778, 784; 442/59, 442/110–116, 228–231, 316, 317; 428/378–381, 389; 427/123–125, 427/255.28
See application file for complete search history.

(56) References Cited

U.S. PATENT DOCUMENTS

| | | |
|---|---|---|
| 2006/0172179 A1 | 8/2006 | Gu et al. |
| 2009/0008712 A1 | 1/2009 | Choi et al. |
| 2009/0035555 A1* | 2/2009 | Brahim et al. ................ 428/328 |
| 2009/0196985 A1 | 8/2009 | Jiang et al. |
| 2011/0198542 A1 | 8/2011 | Chung et al. |

FOREIGN PATENT DOCUMENTS

WO     2010101418 A2     9/2010

OTHER PUBLICATIONS

Maruyama et al., "Carbon Nanotubes and Nanofibers in Composite Materials," SAMPE Journal, vol. 28, May/Jun. 2002, pp. 59-70.
Yao et al., "High-Field Electrical Transport in Single-Wall Carbon Nanotubes," Physical Review Letters, vol. 84, No. 13, Mar. 27, 2000, pp. 2941-2944.
Rao et al., "Evidence for charge transfer in doped carbon nanotube bundles from Raman scattering," Letters to Nature, Nature, vol. 388, Jul. 17, 1997, pp. 257-259.
Smalley, Richard E., "Discovering the fullerenes," Reviews of Modern Physics, vol. 69, No. 3, Jul. 1997, pp. 723-730.
Curl, Robert F., "Dawn of the fullerenes: experiment and conjecture," Reviews of Modern Physics, vol. 69, No. 3, Jul. 1997, pp. 691-702.
Hafner et al., "From Fullerenes to Nanotubes," The Chemical Physics of Fullerene 10 (and 5) Years Later, Lower Academic Publishers, Printed in the Netherlands, pp. 19-26 (10 pgs).

(Continued)

*Primary Examiner* — Matthew Matzek
(74) *Attorney, Agent, or Firm* — Armstrong Teasdale LLP

(57) ABSTRACT

In one embodiment, a bulk carbon nanotube and metallic composite is provided. The bulk carbon nanotube and metallic composite includes a bulk carbon nanotube material layer including a plurality of carbon nanotubes, and a metal film applied across the bulk carbon nanotube material layer. The metal film penetrates into the interstices between individual carbon nanotubes to reduce an electrical resistance between the plurality of carbon nanotubes.

9 Claims, 2 Drawing Sheets

(56) References Cited

OTHER PUBLICATIONS

Ebbesen et al., "Electrical conductivity of individual carbon nanotubes," Letters to Nature, Nature, vol. 382, Jul. 4, 1996, pp. 54-56.
Ruoff et al., "Single Crystal Metals Encapsulated in Carbon Nanoparticles," Science, New Series, vol. 259, No. 5093, Jan. 15, 1993, pp. 346-348.
Fischer, J.E., "Metallic resistivity in crystalline ropes of single-wall carbon nanotubes," The American Physical Society, Physical Review B, vol. 55, No. 8, Feb. 15, 1997, pp. R4921-R4924.
Mintmire, J.W., "Are Fullerene Tubules Metallic?," The American Physical Society, Physical Review Letters, vol. 68, No. 5, Feb. 3, 1992, pp. 631-634.
Smalley et al., "Self-Assembly of Fullerene Tubes and Balls," Proceedings of the Robert A. Welch Foundation Conferences on Chemical Research, Oct. 23-34, 1995 (30 pgs).
International Search Report and Written Opinion of International Application No. PCT/US2013/049551; Sep. 4, 2013; 9 pages.
S. Iijima, "Carbon nanotubes: past, present, and future" Physica B, 323, 2002, pp. 1-5.
C. Chen et al., "A method for creating reliable and low-resistance contacts between carbon nanotubes and microelectrodes", Carbon, 45, 2007, pp. 436-442.
L. Megalini et al., "Impedance of Aligned Carbon Nanotube Arrays and Polymeric Nanocomposites," Journal of Nano Systems & Technology, vol. 1, No. 1, Oct. 2009, pp. 1-16.
B. Zhao et al., "Improvement of carbon nanotube field emission properties by ultrasonic nanowelding," Applied Surface Science, 255, 2008, pp. 2087-2090.
K. Banerjee et al., "Are Carbon Nanotubes the Future of VLSI Interconnections?", 43rd ACM/IEEE Design Automation Conference (DAC), Jul. 24-28, 2006, pp. 809-814.
F. Balle et al., "Ultrasonic Metal Welding of Aluminium Sheets to Carbon Fibre Reinforced Thermoplastic Composites," Advanced Engineering Materials 2009, vol. 11, No. 1-2, pp. 35-39.
Yu et al., "Three-dimensional manipulation of carbon nanotubes under a scanning electron microscope," Nanotechnology 10, 1999, pp. 244-252.
P. Collins et al., "Nanoscale electronic devices on carbon nanotubes," Nanotechnology 9, 1998, pp. 153-157.
R.E. Smalley, "Nanotechnology and the next 50 years," Presentation, University of Dallas—Board of Councilors, Dec. 7, 1995, retrieved from http://cohesion.rice.edu/naturalsciences/smalley/smalley.cfm?doc_id=5336.
S. Tans et al., "Individual single-wall carbon nanotubes as quantum wires," Nature, vol. 386, Apr. 3, 1997, pp. 474-477.
A. Thess et al., "Crystalline Ropes of Metallic Carbon Nanotubes," Science, vol. 273, Jul. 26, 1996, pp. 483-487.
R.S. Lee et al., "Conductivity enhancement in single-walled carbon nanotube bundles doped with K and Br," Nature, vol. 388, Jul. 17, 1997, pp. 255-257.
C.L. Kane et al., "Temperature-dependent resistivity of single-wall carbon nanotubes," Europhysics Letters, vol. 41, No. 6, Mar. 15, 1998, pp. 683-688.
L. Grigorian et al., "Reversible Intercalation of Charged Iodine Chains into Carbon Nanotube Ropes," Physical Review Letters, vol. 80, No. 25, Jun. 22, 1998, pp. 5560-5563.
A. Claye et al., "In-Situ Raman Scattering Studies of Alkali-Doped Single Wall Carbon Nanotubes," Chemical Physics Letters, vol. 333, Issues 1-2, Jan. 5, 2001, post-print version retrieved from University of Pennsylvania ScholarlyCommons, Departmental Papers (MSE), Department of Materials Science & Engineering, pp. 1-12 at website http://repository.upenn.edu/mse_papers/66.
C. Dekker, "Carbon Nanotubes as Molecular Quantum Wires," Physics Today, May 1999, pp. 22-28.

* cited by examiner

BULK CARBON NANOTUBE AND METALLIC COMPOSITES AND METHOD OF FABRICATING

BACKGROUND OF THE DISCLOSURE

The field of the disclosure relates generally to composite materials and, more particularly, to bulk carbon nanotube and metallic composites.

At least some known carbon nanotubes (CNT) are formed from a one-atom thick sheet of graphite commonly referred to as "graphene". The sheet is rolled into a cylinder that has a diameter of the order of a nanometer and a length on the order of a micrometer. Known CNTs exhibit extraordinary strength and electrical properties, and are efficient conductors of heat. The two most common types of CNTs are single-walled carbon nanotubes (SWCNTs) that are formed from a single layer of graphene, and multi-walled carbon nanotubes (MWCNTs) that are formed from multiple concentric cylinders or a graphene sheet that is rolled around itself.

CNTs are lightweight and have a very high elastic modulus. The conductive properties of CNTs depend upon the diameter and the chirality of the hexagonal carbon lattice extending along the tube. A slight change in the winding of the hexagonal lattice along the tube can result in the CNT functioning either as a metal or a semiconductor. For example, hexagonal rows that are parallel to the tube axis produce a metallic structure known as an "armchair" configuration. In contrast, alternating rows of carbon bonds around the tube circumference produce a semi-conducting structure known as a "zigzag" configuration. Although individual CNTs may be highly electrically conductive, high contact resistance between multiple CNTs results in low electrical conductivity of bulk CNT materials.

BRIEF DESCRIPTION OF THE DISCLOSURE

In one embodiment, a bulk carbon nanotube and metallic composite is provided. The bulk carbon nanotube and metallic composite includes a bulk carbon nanotube material layer including a plurality of carbon nanotubes, and a metal film applied across the bulk carbon nanotube material layer. The metal film penetrates into the interstices between individual carbon nanotubes to reduce an electrical resistance between the plurality of carbon nanotubes.

In another embodiment, a bulk carbon nanotube and metallic composite strip is provided. The bulk carbon nanotube and metallic composite strip includes a first bulk carbon nanotube and metallic composite coupled to a second bulk carbon nanotube and metallic composite. The first and second bulk carbon nanotube and metallic composites each include a bulk carbon nanotube material layer comprising a plurality of carbon nanotubes, and a metal film applied across the bulk carbon nanotube material layer. The metal film penetrates into the interstices between individual carbon nanotubes to reduce an electrical resistance between the plurality of carbon nanotubes.

In yet another embodiment, a method of fabricating a bulk carbon nanotube and metallic composite is provided. The method includes forming a first bulk carbon nanotube material layer comprising a plurality of carbon nanotubes, and depositing a metal film across the bulk carbon nanotube material layer. The metal film penetrates into the interstices between individual carbon nanotubes to reduce an electrical resistance between the plurality of carbon nanotubes.

DETAILED DESCRIPTION OF THE DISCLOSURE

Figure 1:
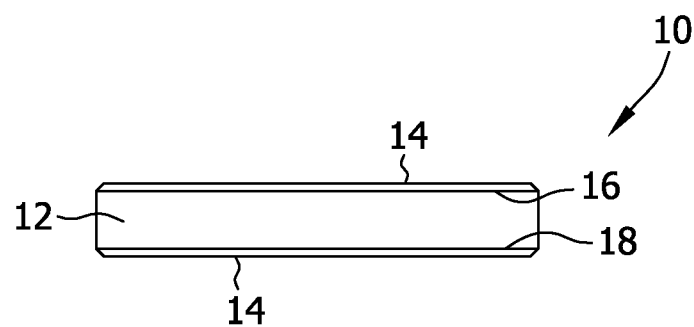
FIG. 1 is schematic view of an exemplary bulk CNT and metallic composite.
Figure 2:
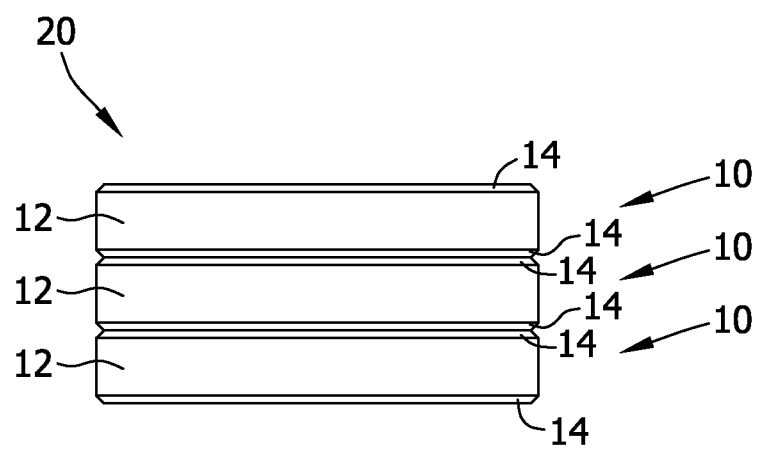
FIG. 2 is a schematic view of an exemplary bulk CNT and metallic composite strip.

FIG. 1 illustrates an exemplary bulk carbon nanotube (CNT) and metallic composite 10 that includes a bulk CNT material layer 12 and one or more thin metal films or layers 14. In the exemplary embodiment, bulk CNT layer 12 includes opposed first and second sides 16 and 18, respectively, and a layer of metal film 14 is deposited across each side 16 and 18. FIG. 2 illustrates an exemplary bulk CNT and metallic composite strip 20 that is fabricated by welding bulk CNT layers 12 together, as will be described in more detail. The methods described herein produce a bulk CNT and metallic composite strip 20 that has a high weight-normalized electrical conductivity, a high thermal conductivity, and a high mechanical strength.

In the exemplary embodiment, bulk CNT layer 12 is fabricated from a plurality of metallic CNTs (not shown), such as "armchair" CNTs, that are each oriented with a chiral angle that is substantially parallel to the tube axis of each CNT. When a graphene sheet (not shown) that forms each CNT is wrapped with an armchair chirality, each formed CNT has an increased metallic character and has an increased capability for tremendously high current density. Alternatively, bulk CNT layer 12 may include a number of semi-conductor CNTs (not shown) in addition to the metallic CNTs. In the exemplary embodiment, bulk CNT layer 12 is a non-woven sheet or a yarn. Alternatively, any other form of bulk CNT layer 12 may be used that enables composite 10 to function as described herein.

In the exemplary embodiment, metal film 14 is applied across CNT layer sides 16 and 18 and penetrates into the interstices between individual CNTs. In the exemplary embodiment, the amount of metal used to form metal film 14 is enough to facilitate low electrical resistance interconnects between a substantial number of the CNTs. In the exemplary embodiment, metal film 14 is a thin-film of aluminum that penetrates the bulk CNT layer 12 and coats a large fraction of the CNTs. Alternatively, metal film 14 may be any electrically conductive metal or combination of metals that enables bulk CNT and metallic composite 10 to function as described herein. In the exemplary embodiment, metal film 14 is applied directly across CNT layer 12 via chemical vapor deposition and/or electroless plating. As such, in the exemplary embodiment, the process facilitates depositing metal within the interstices of the bulk CNT layer. Alternatively, metal film 14 may be applied via a sputtering and/or a physical vapor deposition process. However, any other metal deposition process may be used that enables bulk CNT and metallic composite 10 to function as described herein.

In the exemplary embodiment, multiple bulk CNT and metallic composites 10 are coupled together via a welding process that forms a bulk CNT and metallic composite strip 20. In the exemplary embodiment, and as shown in FIG. 2, three CNT and metallic composites 10 are coupled together along their sides 16 and/or 18. Additionally, CNT and metallic composites 10 may be joined in an end-to-end orientation (not shown). Moreover, any number of CNT and metallic composites 10 may be coupled together to form a bulk CNT and metallic composite strip 20 with any desired length, width and/or thickness. In the exemplary embodiment, CNT and metallic composites 10 are joined together via an ultrasonic welding process. Alternatively, CNT and metallic composites 10 are joined together via an ultrasonic additive manufacturing (UAM) process that sequentially couples layers of patterned metal together to produce net shape products having complex interior cavities.

Figure 3:
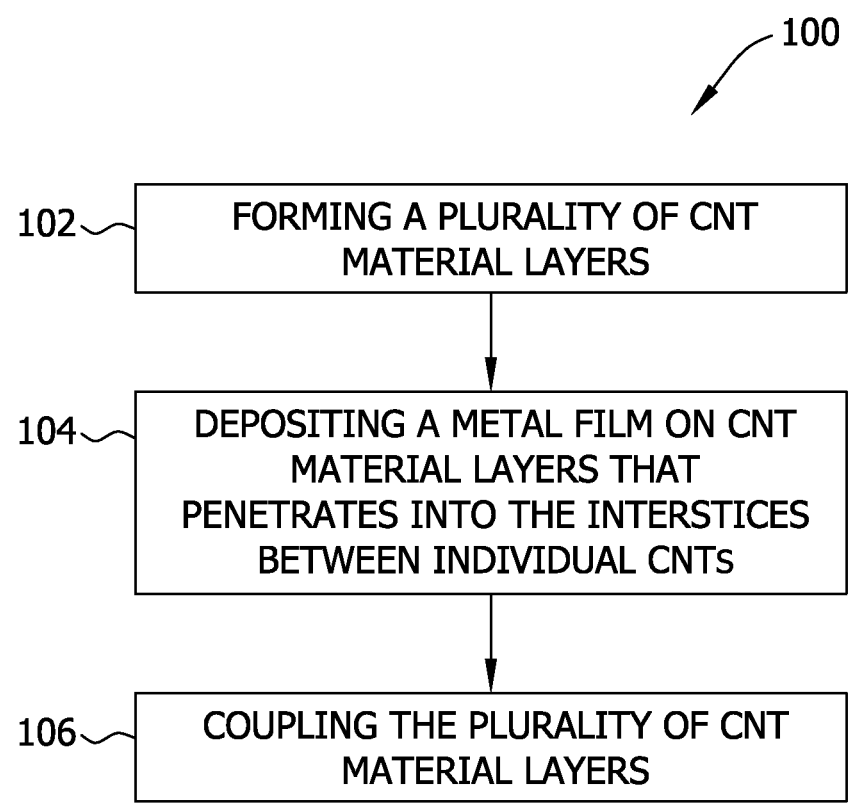
FIG. 3 is a block diagram of an exemplary method of fabricating a bulk CNT and metallic composite strip.

FIG. 3 illustrates an exemplary method 100 of fabricating a bulk CNT and metallic composite strip 20. Method 100 includes forming 102 a plurality of CNT material layers 12 from a plurality of single-walled carbon nanotubes (SWCNTs) and/or multi-walled carbon nanotubes (MWCNTs). In the exemplary embodiment, CNT material layers 12 are a non-woven sheet or a yarn. The method further includes depositing 104 a metal film 14 across one or more sides 16 and 18 of CNT material layer 12 to form a bulk CNT and metallic composite 10. In the exemplary embodiment, metal film 14 is deposited by at least one of a chemical vapor deposition, an electroless plating, a sputtering, and a physical vapor deposition process. The method also includes coupling 106 multiple bulk CNT and metallic composites 10 together to form a bulk CNT and metallic composite strip 20. In the exemplary embodiment, bulk CNT and metallic composites 10 are coupled together via at least one of an ultrasonic welding and an ultrasonic additive manufacturing process.

EXAMPLE

In one example, non-woven sheets of bulk CNT material layers 12 are fabricated from individual SWCNTs having a diameter between about 2 nm and about 5 nm, individual MWCNTs having a diameter between about 20 nm and about 50 nm, or a combination of both. Each bulk CNT layer 12 is formed with a cross-sectional thickness of between about 20 µm and about 100 µm. A bulk CNT and metallic composite 10 is formed by coating each side 16 and 18 of bulk CNT layer 12 with approximately 3,000 Å (0.3 µm) of metallic material. For example, in the exemplary embodiment, a metallic material such as aluminum, copper, nickel, titanium, silver, gold or chromium, or any combination thereof, may be used to form metallic composite 10. Alternatively, any metallic material may be used that enables metallic composite 10 to function as described herein. The resulting bulk CNT and metallic composites 10 are coupled together via an ultrasonic welding process to form a bulk CNT and metallic composite strip 20. The ultrasonic welding process facilitates reducing open space within composites 10 and reducing a thickness of each bulk CNT and metallic composite 10 by approximately 20%. As such, bulk CNT and metallic composite 10 has a decreased electrical resistance between individual CNTs and a decreased electrical resistance. In the example, bulk CNT and metallic composite strip 20 is fabricated with dimensions measuring roughly one cm wide, 10 cm long, and is one to several composites 10 thick.

As described herein, a bulk CNT and metallic composite is fabricated with an increased specific electrical conductivity that is superior to other materials such as copper and aluminum. In addition, the composite exhibits a high electrical conductivity, a high thermal conductivity, and a high mechanical strength. The bulk CNT composite formed with the above techniques reduces contact resistance between individual CNTs and reduced open space within each bulk CNT and metallic composite. Further, a plurality of bulk CNT and metallic composites are coupled to form a high strength, highly electrically conductive bulk CNT and metallic composite strip. The bulk CNT composite material having superior qualities makes it ideal for applications such as EMI shielding, wire conductors for power transmission line, spacecraft harness, and electric motors.

This written description uses examples to disclose the various embodiments, including the best mode, and also to enable any person skilled in the art to practice such embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A composite assembly comprising:
a plurality of bulk carbon nanotube and metallic composites, wherein each bulk carbon nanotube and metallic composite of said plurality of bulk carbon nanotube and metallic composites comprises:
a bulk carbon nanotube material layer comprising a plurality of carbon nanotubes; and
a metal film applied across an outer surface of said bulk carbon nanotube material layer using at least one of a chemical vapor deposition process an electroless plating process, a sputtering process, and a physical vapor deposition process such that said metal film penetrates through said outer surface and into interstices between individual carbon nanotubes, wherein at least a portion of said plurality of carbon nanotubes remain uncoated with said metal film and said metal film facilitates reducing an electrical resistance between said plurality of carbon nanotubes, wherein said plurality of bulk carbon nanotube and metallic composites are coupled together using at least one of an ultrasonic welding process and an ultrasonic additive manufacturing process.

2. The composite assembly of claim 1, wherein at least a portion of said plurality of carbon nanotubes are metallic carbon nanotubes.

3. The composite assembly of claim 1, wherein said plurality of carbon nanotubes comprises at least one of single-walled carbon nanotubes and multi-walled carbon nanotubes.

4. The composite assembly of claim 1, wherein said bulk carbon nanotube material layer is at least one of a non-woven sheet and a yarn.

5. The composite assembly of claim 1, wherein said metal film comprises at least one of aluminum, nickel, copper, titanium, silver, gold and chromium.

6. A bulk carbon nanotube and metallic composite strip comprising:
a first bulk carbon nanotube and metallic composite coupled to a second bulk carbon nanotube and metallic composite, said first bulk carbon nanotube and metallic composite coupled to said second bulk carbon nanotube and metallic composite using at least one of an ultrasonic welding process and an ultrasonic additive manufacturing process, said first and second bulk carbon nanotube and metallic composites each comprising:
a bulk carbon nanotube material layer comprising a plurality of carbon nanotubes; and
a metal film applied across an outer surface of said bulk carbon nanotube material layer using at least one of a chemical vapor deposition process, an electroless plating process, a sputtering process, and a physical vapor deposition process such that said metal film penetrates through said outer surface and into interstices between individual carbon nanotubes, wherein at least a portion of said plurality of carbon nanotubes remain uncoated with said metal film and said metal film facilitates reducing an electrical resistance between said plurality of carbon nanotubes.

7. The composite strip of claim 6, wherein at least a portion of said plurality of carbon nanotubes are metallic carbon nanotubes.

8. The composite strip of claim 6, wherein said plurality of carbon nanotubes comprises at least one of single-walled carbon nanotubes and multi-walled carbon nanotubes.

9. The composite strip of claim 6, wherein said bulk carbon nanotube material layer is at least one of a non-woven sheet and a yarn.

\* \* \* \* \*